(12) United States Patent
Saito et al.

(10) Patent No.: US 10,982,048 B2
(45) Date of Patent: Apr. 20, 2021

(54) ORGANOSILICON-MODIFIED POLYIMIDE RESIN COMPOSITION AND USE THEREOF

(71) Applicant: JIAXING SUPER LIGHTING ELECTRIC APPLIANCE CO., LTD, Jiaxing (CN)

(72) Inventors: Yukihiro Saito, Jiaxing (CN); Hayato Unagiike, Jiaxing (CN)

(73) Assignee: JIAXING SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 40 days.

(21) Appl. No.: 16/260,272

(22) Filed: Jan. 29, 2019

(65) Prior Publication Data

US 2019/0315921 A1   Oct. 17, 2019

(30) Foreign Application Priority Data

| Apr. 17, 2018 | (CN) | 201810344630.9 |
| May 23, 2018 | (CN) | 201810498980.0 |
| Aug. 30, 2018 | (CN) | 201811005145.5 |
| Aug. 30, 2018 | (CN) | 201811005536.7 |
| Sep. 17, 2018 | (CN) | 201811079889.1 |
| Nov. 19, 2018 | (CN) | 201811378173.1 |

(51) Int. Cl.
| C08L 83/10 | (2006.01) |
| C08G 73/10 | (2006.01) |
| C08G 77/455 | (2006.01) |
| C08L 79/08 | (2006.01) |

(52) U.S. Cl.
CPC ......... *C08G 73/106* (2013.01); *C08G 77/455* (2013.01); *C08L 79/08* (2013.01); *C08L 83/10* (2013.01)

(58) Field of Classification Search
CPC ........... C08L 83/10; C08L 83/14; C08L 79/08
See application file for complete search history.

(56) References Cited

U.S. PATENT DOCUMENTS

| 3,437,636 | A | * | 4/1969 | Angelo | C08G 73/1003 528/73 |
| 4,271,288 | A | * | 6/1981 | Woo | C08G 73/10 428/446 |
| 5,262,505 | A | * | 11/1993 | Nakashima | C08G 77/455 525/431 |
| 5,859,181 | A | * | 1/1999 | Zhao | C08G 73/1042 528/353 |
| 5,942,592 | A | * | 8/1999 | Zhao | C08G 73/1042 528/26 |
| 6,096,850 | A | * | 8/2000 | Chiang | C08G 73/1039 430/170 |
| 6,461,738 | B2 | * | 10/2002 | Ishikawa | C08G 77/455 427/387 |
| 7,041,766 | B2 | * | 5/2006 | Yoneda | C08G 73/106 257/E23.12 |
| 7,399,429 | B2 | | 7/2008 | Liu et al. | |
| 7,432,313 | B2 | * | 10/2008 | Yoneda | C08G 73/106 522/141 |
| 7,482,059 | B2 | | 1/2009 | Peng et al. | |
| 9,360,188 | B2 | | 6/2016 | Kircher et al. | |
| 2004/0072982 | A1 | * | 4/2004 | Yoneda | C08G 73/106 528/26 |
| 2005/0107497 | A1 | | 5/2005 | Akaho | |
| 2007/0267976 | A1 | | 11/2007 | Bohler et al. | |
| 2010/0012362 | A1 | * | 1/2010 | Abe | H05K 3/4626 174/259 |
| 2010/0135009 | A1 | | 6/2010 | Duncan et al. | |
| 2012/0162965 | A1 | | 6/2012 | Takeuchi et al. | |
| 2013/0003346 | A1 | | 1/2013 | Letoquin et al. | |
| 2013/0058080 | A1 | | 3/2013 | Ge et al. | |
| 2014/0185269 | A1 | | 7/2014 | Li | |
| 2014/0218892 | A1 | | 8/2014 | Edwards et al. | |

(Continued)

FOREIGN PATENT DOCUMENTS

| CN | 101208195 A | 6/2008 |
| CN | 101360801 A | 2/2009 |
| CN | 101914357 A | 12/2010 |
| CN | 104231994 A | 12/2014 |
| CN | 105295792 A | 2/2016 |
| CN | 105542693 A | 5/2016 |
| WO | 2017/159538 | * 9/2017 |

*Primary Examiner* — Margaret G Moore
(74) *Attorney, Agent, or Firm* — Qinghong Xu

(57) ABSTRACT

The present disclosure discloses an organosilicon-modified polyimide resin composition, comprising an organosilicon-modified polyimide and a thermal curing agent, wherein the organosilicon-modified polyimide comprises a repeating unit represented by the following general formula (I):

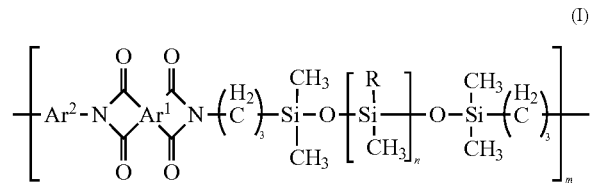

wherein $Ar^1$ is a tetra-valent organic group having a benzene ring or an alicyclic hydrocarbon structure, $Ar^2$ is a di-valent organic group, R is each independently methyl or phenyl, and the thermal curing agent is selected from the group consisting of epoxy resin, isocyanate and bisoxazoline compounds. The resultant organosilicon-modified polyimide resin composition of the present disclosure has superior transmittance, heat resistance and mechanical strength, and is suitable for producing a flexible LED filament.

25 Claims, 8 Drawing Sheets

(56) References Cited

U.S. PATENT DOCUMENTS

| | | |
|---|---|---|
| 2015/0022114 A1 | 1/2015 | Kim |
| 2016/0369952 A1 | 12/2016 | Weekamp |
| 2019/0137047 A1 | 5/2019 | Hu |
| 2019/0277484 A1 | 9/2019 | Kwisthout |

* cited by examiner

ORGANOSILICON-MODIFIED POLYIMIDE RESIN COMPOSITION AND USE THEREOF

BACKGROUND

Technical Field

The present disclosure relates the field of illumination, and specifically to an organosilicon-modified polyimide resin composition.

Description of Related Art

LED is gradually replacing conventional illuminating devices due to its advantages such as environmental friendliness, energy saving, high efficiency and long lifespan. However, the light emitted by conventional LED light resources is directional, and wide angle illumination cannot be achieved as can be done by conventional illuminating devices. In recent years, filaments which make LED light resources achieve 360° omnidirectional illumination similar to that can be done by conventional tungsten lamps has drawn great attention.

Patent Publication No. CN103994349A discloses an LED lamp with high luminous efficiency, wherein a plurality of LED chips are fixed on a transparent substrate which comprises filament electrodes at both ends. The material for the transparent substrate may be transparent glass, microcrystalline glass, transparent ceramic, yttrium aluminum garnet, alumina (sapphire), chlorine oxynitride, yttrium oxide ceramic, calcium oxide ceramic or transparent heat-resistant PC/PS/PMMA. Although the loss of blue light caused by the downward blue light emitted by the LED chip being reflected and passing through the P-N junction can be avoided by using this transparent substrate, the substrate is a hard one which cannot be bent and therefore has a disadvantage of narrow illuminating angle.

Patent Publication No. CN204289439U discloses an LED filament which provides omnidirectional illumination, which comprises a substrate having fluorescent powders mixed therein, an electrode disposed on the substrate, at least one LED chip mounted on the substrate, and a packaging adhesive covering the LED chip. By the substrate formed from a silicone resin comprising fluorescent powders, the cost of making the substrate from glass or sapphire is eliminated. The filament made from said substrate avoids the effect of glass or sapphire on the light emission of the chip, achieves 360° light emission, and significantly improves the emission uniformity and the luminous efficiency. However, as the substrate is formed from silicone resin, it has the disadvantage of poor heat-resistance.

The present application makes further optimization to the above applications, so as to further meet various process requirements.

SUMMARY

The main technical problem to be addressed by the present disclosure is to provide a composition used for a filament substrate or a light-conversion layer to effectively improve the properties of the currently available substrates, such as heat resistance, thermal conductivity, tensile strength and filament performance.

The present disclosure provides a composition which is suitable for use as a filament substrate or a light-conversion layer, wherein the composition comprises at least a main material, a modifier and an additive. The main material is an organosilicon-modified polyimide; the modifier is a thermal curing agent; and the additive comprises microparticles added into the main material, which may comprise fluorescent powders and heat dispersing particles. The additive may also comprise a coupling agent.

The present disclosure provides a composition which is suitable for use as a filament substrate or a light-conversion layer, wherein the main material in the composition is an organosilicon-modified polyimide, i.e. a polyimide comprising a siloxane moiety, wherein the organosilicon-modified polyimide comprises a repeating unit represented by general formula (I):

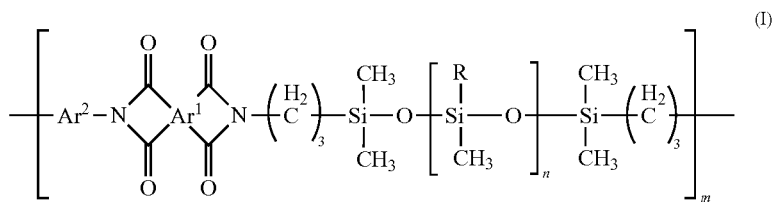

In general formula (I), $Ar^1$ is a tetra-valent organic group having a benzene ring or an alicyclic hydrocarbon structure, $Ar^2$ is a di-valent organic group, R is each independently methyl or phenyl, and n is 1~5.

According to an embodiment of the present disclosure, $Ar^1$ is a tetra-valent organic group having a monocyclic alicyclic hydrocarbon structure or a bridged-ring alicyclic hydrocarbon structure.

According to another embodiment of the present disclosure, $Ar^2$ is a di-valent organic group having a monocyclic alicyclic hydrocarbon structure.

According to another embodiment of the present disclosure, $Ar^1$ is a tetra-valent organic group having a benzene ring or an alicyclic hydrocarbon structure comprising a functional group having active hydrogen, wherein the functional group having active hydrogen is any one of hydroxyl, amino, carboxy and mercapto.

According to another embodiment of the present disclosure, $Ar^2$ is a di-valent organic group comprising a functional group having active hydrogen, wherein the functional group having active hydrogen is any one of hydroxyl, amino, carboxy and mercapto.

According to another embodiment of the present disclosure, $Ar^1$ in the organosilicon-modified polyimide is derived from a dianhydride, and $Ar^2$ is derived from a diamine.

According to another embodiment of the present disclosure, the molar percentage of the diamine comprising a functional group having active hydrogen is 5~25% of the total amount of diamine.

According to another embodiment of the present disclosure, the siloxane content in the organosilicon-modified polyimide is 20~75 wt %.

According to another embodiment of the present disclosure, the siloxane content in the organosilicon-modified polyimide is 30~70 wt %, and the glass transition temperature is below 150° C.

According to another embodiment of the present disclosure, the number average molecular weight of the organosilicon-modified polyimide is 5000~60000, preferably 10000~40000.

According to another embodiment of the present disclosure, the weight of the heat dispersing particles is 1~12 times the weight of the organosilicon-modified polyimide.

The present disclosure provides a composition which is suitable for use as a filament substrate or a light-conversion layer, wherein the modifier in the composition is a thermal curing agent which is selected from the group consisting of epoxy resin, isocyanate and bisoxazoline compounds.

According to another embodiment of the present disclosure, the molar ratio of the thermal curing agent to the functional group having active hydrogen in the organosilicon-modified polyimide is 1:1.

The present disclosure provides a composition which is suitable for use as a filament substrate or a light-conversion layer, wherein the additive in the composition may comprise fluorescent powders, heat dispersing particles and a coupling agent.

According to another embodiment of the present disclosure, the heat dispersing particles are one or more selected from the group consisting of silica, alumina, magnesium oxide, magnesium carbonate, aluminum nitride, boron nitride and diamond.

According to another embodiment of the present disclosure, the heat dispersing particles have an average particle size of from 0.1 μm to 100 μm, preferably from 1 μm to 50 μm.

According to another embodiment of the present disclosure, the fluorescent powders are at least one of red fluorescent powders, yellow fluorescent powders and green fluorescent powders.

According to another embodiment of the present disclosure, the fluorescent powders have spherical, plate or needle shape.

According to another embodiment of the present disclosure, the fluorescent powders have an average particle size of above 0.1 μm; preferably from 1 μm to 100 μm; more preferably from 1 to 50 μm.

According to another embodiment of the present disclosure, the weight ratio of the fluorescent powders to the organosilicon-modified polyimide is 50~800:100, preferably 100~700:100.

According to another embodiment of the present disclosure, the composition further comprises one or more of a defoaming agent, a leveling agent and an adhesive.

The present disclosure provides a composition which is suitable for use as a filament substrate or a light-conversion layer, wherein the additive in the composition may comprise fluorescent powders and heat dispersing particles, wherein the heat dispersing particles have a particle size distribution of 0.1~100 μm, and the content of small particle size (below 1 μm) is about 5-20%, the content of medium particle size (1-30 μm) is about 50-70%, and the content of large particle size (above 30 μm) is about 20-40%.

According to another embodiment of the present disclosure, the amount of the fluorescent powders is no less than 0.05 times, preferably not less than 0.1 times, and no more than 8 time, preferably no more than 7 times, the weight of the organosilicon-modified polyimide.

According to another embodiment of the present disclosure, the weight of the heat dispersing particles is 1~12 times the weight of the organosilicon-modified polyimide.

Another aspect of the present disclosure provides a filament substrate or a light-conversion layer formed from the above organosilicon-modified polyimide composition, wherein the filament substrate or the light-conversion layer has a thermal conductivity of more than 1.8 W/m*K.

According to another embodiment of the present disclosure, the siloxane content in the organosilicon-modified polyimide composition is 20~75 wt %.

According to another embodiment of the present disclosure, the weight of the heat dispersing particles contained in the organosilicon-modified polyimide composition is 1~12 times the weight of the organosilicon-modified polyimide.

Another aspect of the present disclosure provides a filament substrate or a light-conversion layer formed from the above organosilicon-modified polyimide composition, wherein the filament substrate or the light-conversion layer has an elastic modulus of more than 2.0 GPa.

According to another embodiment of the present disclosure, the siloxane content in the organosilicon-modified polyimide composition is 20~75 wt %.

According to another embodiment of the present disclosure, the weight of the heat dispersing particles contained in the organosilicon-modified polyimide composition is 1~12 times the weight of the organosilicon-modified polyimide.

Another aspect of the present disclosure provides a filament substrate or a light-conversion layer formed from the above organosilicon-modified polyimide composition, wherein the filament substrate or the light-conversion layer has an elongation at break of more than 0.5%.

According to another embodiment of the present disclosure, the siloxane content in the organosilicon-modified polyimide composition is 20~75 wt %.

According to another embodiment of the present disclosure, the weight of the heat dispersing particles contained in the organosilicon-modified polyimide composition is 1~12 times the weight of the organosilicon-modified polyimide.

Another aspect of the present disclosure provides a filament substrate or a light-conversion layer formed from the above composition.

Comparing with the prior art, the present disclosure achieves one or more of the following advantages:

a) Using the organosilicon-modified polyimide as the body, the organosilicon-modified polyimide resin composition formed by adding a thermal curing agent has excellent heat resistance, mechanical strength and transparency;

b) Using the organosilicon-modified polyimide resin composition as the filament substrate, the filament has good flexibility, so that the filament can be made into various shapes to achieve 360° omnidirectional illumination; and c) The amidation is carried out by vacuum defoaming or in a nitrogen atmosphere, so that the volumetric percentage of cells in the organosilicon-modified polyimide is 5~20%; accordingly, the light emission is more uniform after the light emitted by the LED chip is refracted by the cells.

The present disclosure further provides a modification method, in which the properties of the filament substrate or the light-conversion layer can be modified by adjusting the type and the content of one or more of the main material, the modifier (thermal curing agent) and the additive in the organosilicon-modified polyimide, so as to meet special environmental requirements.

DETAILED DESCRIPTION

Figure 1:
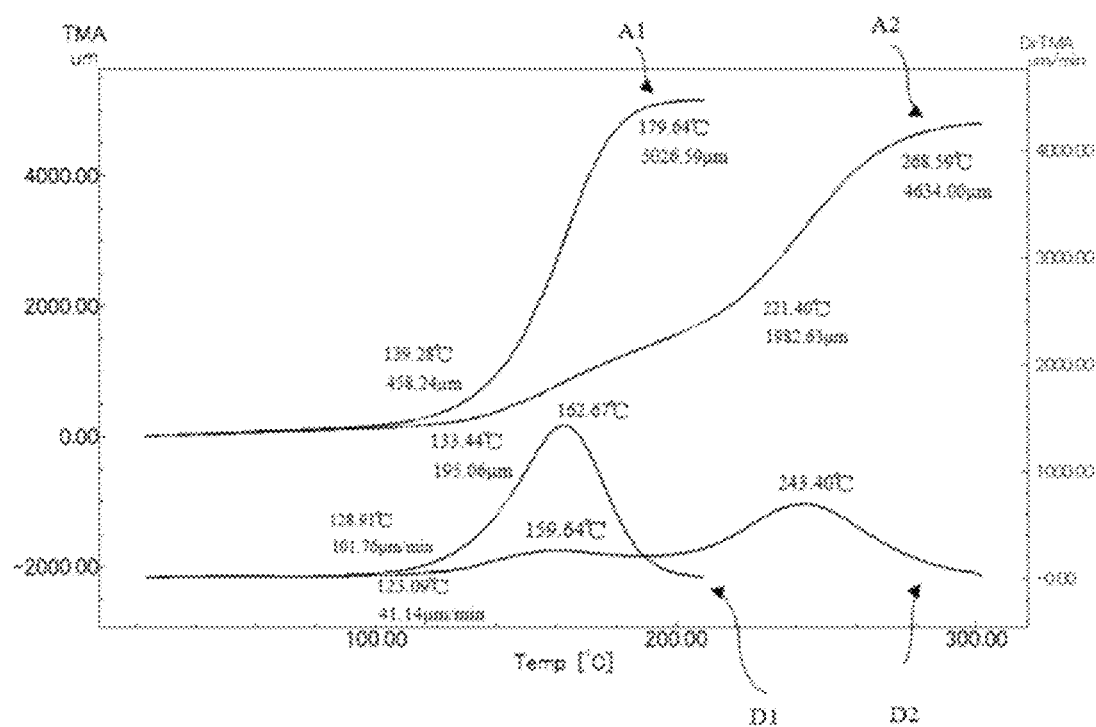
FIG. 1 shows the TMA analysis of the polyimide before and after adding the thermal curing agent.

The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general formula (I):

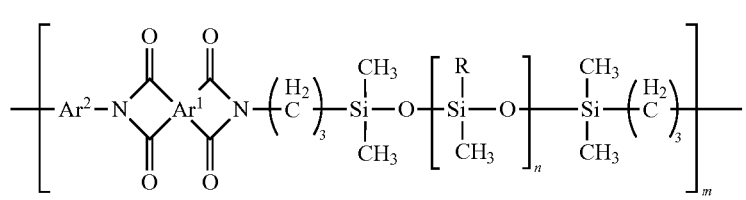

In general formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing; especially the elongation tends to decrease. On the other hand, when it exceeds 100000, the viscosity becomes too high and the resin is hard to be formed.

$Ar^1$ is a moiety derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran-5-carboxamide) (6FAP-ATA), and N,N'-(9H-fluoren-9-ylidenedi-4,1-phenylene)bis[1,3-dihydro-1,3-dioxo-5-isobenzofuran carboxamide] (FDA-ATA). Examples of the aromatic anhydride comprising ester group include p-phenylene bis(trimellitate)dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), and 2,3,3',4'-diphenyl ether tetracarboxylic dianhydride (aODPA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo[1,2-C:4,5-C']difuran-1,3,5,7-tetrone (BODA), cyclobutane-1,2,3,4-tetracarboxylic dianhydride (CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenone tetracarboxylic dianhydride (BTDA), cyclobutane tetracarboxylic dianhydride (CBDA) and 4,4'-(hexafluoroisopropylidene)diphthalic anhydride (6FDA) are preferred. The above dianhydride can be used alone or in combination.

$Ar^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine, 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl) propane, 4,4'-diamino-2,2'-dimethylbiphenyl (APB). The fluorinated aromatic diamine includes 2,2'-bis(trifluoromethyl) benzidine (TFMB), 2,2-bis(4-aminophenyl)hexafluoropropane (6FDAM), 2,2-bis[4-(4-aminophenoxy)phenyl] hexafluoropropane (HFBAPP), and 2,2-bis(3-amino-4-methylphenyl) hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate (BPTP), and 4-aminophenyl 4-aminobenzoate (APAB). The aromatic diamine comprising ether group includes 2,2-bis[4-(4-aminophenoxy)phenyl]propane) (BAPP), 2,2'-bis[4-(4-aminophenoxy) phenyl] propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis (4-aminophenoxy)biphenyl (BAPB). The aromatic diamine comprising amido group includes N,N'-bis(4-aminophenyl) benzene-1,4-dicarboxamide (BPTPA), 3,4'-diaminobenzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylenediyl-dibenzoic acid). The aromatic diamine comprising hydroxyl group includes 3,3'-dihydroxybenzidine (HAB), and 2,2-bis(3-amino-4-hydroxyphenyl) hexafluoropropane (6FAP). The aromatic diamine comprising carboxy group includes 6,6'-diamino-3,3'-methylenedibenzoic acid (MBAA), and 3,5-diaminobenzoic acid (DBA). The aromatic diamine comprising sulfonyl group includes 3,3'-diaminodiphenylsulfone (DDS), 4,4'-diaminodiphenylsulfone, bis[4-(4-aminophenoxy)phenyl] sulfone (BAPS) (or referred to as 4,4'-bis(4-aminophenoxy) diphenylsulfone), and 3,3'-diamino-4,4'-dihydroxydiphenylsulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1, 3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis (3'-amino-5'-trifluoromethylphenoxy) biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane (BAP), 2,2-bis (3-amino-4-hydroxyphenyl)hexafluoropropane (6FAP), 1,3-bis(3-hydroxy-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising mercapto group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly(amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and fluorescent powders can also be added at the state of poly(amic acid) to give the substrate. In addition, solubilized polyimide can also be obtained by direct heating and dehydration after mixing alicylic anhydride and diamine. Such solubilized polyimide, as an adhesive material, has a good light transmittance. In addition, it is liquid state; therefore, other solid materials (such as the inorganic heat dispersing particles and the fluorescent powders) can be dispersed in the adhesive material more sufficiently.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride (6FDA), 20 micromole (mmol) of 2,2-bis(3-amino-4-hydroxyphenyl)hexafluoropropane (6FAP), 50 micromole (mmol) of 2,2'-di(trifluoromethyl) diaminobiphenyl (TFMB) and 130 micromole (mmol) of aminopropyl-terminated poly(dimethylsiloxane) are used to give the PI synthesis solution.

The above methods can be used to produce amino-terminated polyimide compounds.

However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure. Alternatively, a diamine comprising vinyl siloxane structure can be used.

The molar ratio of dianhydride to diamine may be 1:1. The molar percentage of the diamine comprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the fluorescent powders and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

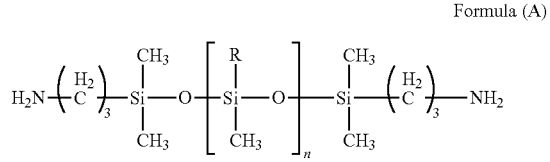

wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the fluorescent powders or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethylether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol dimethyl ether, diethylene glycol diethyl ether, diethylene glycol methyl ethyl ether, dipropylene glycol dimethyl ether or diethylene glycol dibutyl ether, and diethylene glycol butyl methyl ether. The ester-type organic solvent includes acetates, including ethylene glycol monoethyl ether acetate, diethylene glycol monobutyl ether acetate, propylene glycol monomethyl ether acetate, propyl acetate, propylene glycol diacetate, butyl acetate, isobutyl acetate, 3-methoxybutyl acetate, 3-methyl-3-methoxybutyl acetate, benzyl acetate and 2-(2-butoxyethoxy)ethyl acetate; and methyl lactate, ethyl lactate, n-butyl acetate, methyl benzoate and ethyl benzoate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isobutanol, isopentanol, 4-methyl-2-pentanol, 3-methyl-2-butanol, 3-methyl-3-methoxybutanol, and diacetonealcohol. The aromatic hydrocarbon solvent includes toluene and xylene. Other solvents include γ-butyrolactone, N-methylpyrrolidone, N,N-dimethylformamide, N,N-dimethylacetamide and dimethylsulfoxide.

The present disclosure provides an organosilicon-modified polyimide resin composition comprising the above organosilicon-modified polyimide and a thermal curing agent, which may be epoxy resin, isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and fluorescent powders.

Light Transmittance

The factors affecting the light transmittance of the organosilicon-modified polyimide resin composition at least include the type of the main material, the type of the modifier (thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as a substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the fluorescent powders in the organosilicon-modified polyimide resin composition may have certain effect on the transmittance test, the organosilicon-modified polyimide resin composition used for the transmittance test does not comprise fluorescent powders. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer. In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Adding different thermal curing agents imposes different effects on the light transmittance of the organosilicon-modified polyimide. Table 1-1 shows the effect of the addition of different thermal curing agents on the light transmittance of the full aliphatic organosilicon-modified polyimide. At the main light-emitting wavelength of 450 nm for the blue LED chip, the addition of different thermal curing agents renders no significant difference to the light transmittance of the full aliphatic organosilicon-modified polyimide; while at a short wavelength of 380 nm, the addition of different thermal curing agents does affect the light transmittance of the full aliphatic organosilicon-modified polyimide. The organosilicon-modified polyimide itself has a poorer transmittance to the light having a short wavelength (380 nm) than to the light having a long wavelength (450 nm). However, the extent of the difference varies with the addition of different thermal curing agents. For example, when the thermal curing agent KF105 is added to the full aliphatic organosilicon-modified polyimide, the extent of the reduction in the light transmittance is less. In comparison, when the thermal curing agent 2021p is added to the full aliphatic organosilicon-modified polyimide, the extent of the reduction in the light transmittance is more. Accordingly, in an embodiment, if the LED chips used in the LED filament have a uniform quality, and emit less blue light having a short wavelength, the thermal curing agent BPA or the thermal curing agent 2021p may be added. In comparison, in an embodiment, if the LED chips used in the LED filament have different qualities, and emit more blue light having a short wavelength, the thermal curing agent KF105 may be used. Both Table 1-1 and Table 1-2 show the results obtained in the transmittance test using Shimadzu UV-Vis Spectrometer UV-1800. The light transmittances at wavelengths 380 nm, 410 nm and 450 nm are tested based on the light emission of white LEDs.

TABLE 1-1

| Organosilicon-Modified Polyimides | Thermal Curing Agent | | Light Transmittance (%) | | | Film Thickness (μm) | Mechanical Strength | |
|---|---|---|---|---|---|---|---|---|
| | Types | Amount (%) | 380 nm | 410 nm | 450 nm | | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 44 | 43.4 | 8.0 |
| Full Aliphatic | KF105 | 8.0 | 87.2 | 88.9 | 90.4 | 44 | 72.6 | 7.1 |
| Full Aliphatic | EHPE3150 | 8.0 | 87.1 | 88.9 | 90.5 | 44 | 40.9 | 13.1 |
| Full Aliphatic | 2021p | 8.0 | 86.1 | 88.1 | 90.1 | 44 | 61.3 | 12.9 |

Even when the same thermal curing agent is added, different added amount thereof will have different effects on the light transmittance. Table 1-2 shows that when the added amount of the thermal curing agent BPA to the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to certain degree, adding more thermal curing agent will have limited effect on the light transmittance.

TABLE 1-2

| Organosilicon-Modified Polyimide | Thermal Curing Agent | | Light Transmittance (%) | | | Film Thickness (mm) | Mechanical Strength | |
|---|---|---|---|---|---|---|---|---|
| | Type | Amount (%) | 380 nm | 410 nm | 450 nm | | Elongation (%) | Tensile Strength (MPa) |
| Full Aliphatic | BPA | 4.0 | 86.2 | 88.4 | 89.7 | 44 | 22.5 | 9.8 |
| Full Aliphatic | | 8.0 | 87.1 | 89.1 | 90.6 | 44 | 24.4 | 10.5 |
| Full Aliphatic | | 12.0 | 87.3 | 88.9 | 90.5 | 44 | 20.1 | 9.0 |

TABLE 2

| Organosilicon-Modified Polyimide | Siloxane Content (wt %) | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | ○ | 90 |
| 3 | 45 | BPA | 145 | 24.2 | 1.1 | 15 | 97 | Δ | 90 |
| 4 | 64 | BPA | 30 | 8.9 | 0.04 | 232 | 94 | ○ | 92 |
| 5 | 73 | BPA | 0 | 1.8 | 0.001 | 291 | 96 | ○ | 95 |

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 2, when the siloxane content is only 37 wt %, the light transmittance is only 85%. When the siloxane content is increase to above 45%, the light transmittance exceeds 94%.

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and full aliphatic organosilicon-modified polyimide have superior heat resistance, and are suitable for producing the filament substrate or the light-conversion layer. Detailed results from the accelerated heat resistance and aging tests (300° C.×1 hour) show that the fluorinated aromatic organosilicon-modified polyimide has better heat resistance than the aliphatic organosilicon-modified polyimide. Accordingly, in an embodiment, if a high power, high brightness LED chip is used in the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 2, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

Adding a thermal curing agent can lead to increased heat resistance and glass transition temperature. As shown in FIGS. 1, A1 and A2 represent the curves before and after adding the thermal curing agent, respectively; and the curves D1 and D2 represent the values after differential computation on curves A1 and A2, respectively, representing the extent of the change of curves A1 and A2. As can be seen from the analysis results from TMA (thermomechanical analysis) shown in FIG. 1, the addition of the thermal curing agent leads to a trend that the thermal deformation slows down. Accordingly, adding a thermal curing agent can lead to increase of the heat resistance.

In the cross-linking reaction between the organosilicon-modified polyimide and the thermal curing agent, the thermal curing agent should have an organic group which is capable of reacting with the functional group having active hydrogen in the polyimide. The amount and the type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicylic epoxy resin, such as 3,4-epoxycyclohexylmethyl3,4-epoxycyclohexanecarboxylate (2021P), EHPE3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the functional group having active hydrogen in the organosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the fluorescent powders, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise fluorescent powders for obtaining the desired light-emitting properties. The fluorescent powders can convert the wavelength of the light emitted from the light-emitting semiconductor. For example, yellow fluorescent powders can convert blue light to yellow light, and red fluorescent powders can convert blue light to red light. Examples of yellow fluorescent powders include transparent fluorescent powders such as $(Ba,Sr,Ca)_2SiO_4$:Eu, and $(Sr,Ba)_2SiO_4$:Eu(barium orthosilicate (BOS)); silicate-type fluorescent powders having a silicate structure such as $Y_3Al_5O_{12}$:Ce (YAG(yttrium.aluminum.garnet):Ce), and $Tb_3Al_3O_{12}$:Ce (YAG(terbium.aluminum.garnet):Ce); and oxynitride fluorescent powders such as Ca-α-SiAlON. Examples of red fluorescent powders include nitride fluorescent powders, such as $CaAlSiN_3$:Eu, and $CaSiN_2$:Eu. Examples of green fluorescent powders include rare earth-halide fluorescent powders, and silicate fluorescent powders. The ratio of the fluorescent powders in the organosilicon-modified polyimide resin composition may be determined arbitrarily according to the desired light-emitting property. In addition, since the fluorescent powders have a thermal conductivity which is significantly higher than that of the organosilicon-modified polyimide resin, the thermal conductivity of the organosilicon-modified polyimide resin composition as a whole will increase as the ratio of the fluorescent powders in the organosilicon-modified polyimide resin composition increases. Accordingly, in an embodiment, as long as the light-emitting property is fulfilled, the content of the fluorescent powders can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the fluorescent powders in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the fluorescent powders included in the organosilicon-modified polyimide resin composition are particulate, and the shape thereof may be sphere, plate or needle, preferably sphere. The maximum average length of the fluorescent powders (the average particle size when they are spherical) is above 0.1 preferably over 1 further preferably 1~100 and more preferably 1~50 The content of fluorescent powders is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the fluorescent powders is no less than 5 parts in weight, preferably no less than 10 parts in weight, and no more than 800 parts in weight, preferably no more than 700 parts in weight. When the content of the fluorescent powders in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of fluorescent powders are added at the same time. For example, when red fluorescent powders and green fluorescent powders are added at the same time, the added ratio of red fluorescent powders to green fluorescent powders is 1:5~8, preferably 1:6~7. In another embodiment, red fluorescent powders and yellow fluorescent powders are added at the same time, wherein the added ratio of red fluorescent powders to yellow fluorescent powders is 1:5~8, preferably 1:6~7. In another embodiment, three or more kinds of fluorescent powders are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or combination thereof is preferably. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.15~0.35.

TABLE 3-1

| | | | | | | | |
|---|---|---|---|---|---|---|---|
| Weight Ratio [wt %] | 0.0% | 37.9% | 59.8% | 69.8% | 77.6% | 83.9% | 89.0% |
| Volume Ratio [vol %] | 0.0% | 15.0% | 30.0% | 40.0% | 50.0% | 60.0% | 70.0% |
| Thermal Conductivity[W/m*K] | 0.17 | 0.20 | 0.38 | 0.54 | 0.61 | 0.74 | 0.81 |

Table 3-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 3-1 and 3-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

Figure 2:
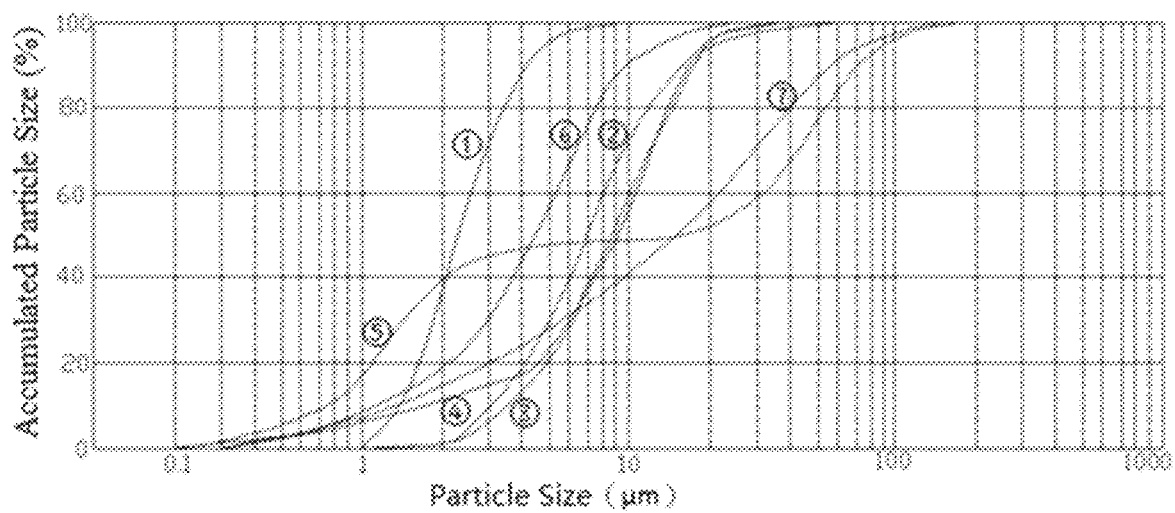
FIG. 2 shows the particle size distributions of the heat dispersing particles with different specifications.

For the effects of the particle size and the particle size distribution of the heat dispersing particles on the thermal conductivity of the organosilicon-modified polyimide resin composition, see both Table 3-2 and FIG. 2. Table 3-2 and FIG. 2 show 7 heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significant superior to that of specification 5 due to the difference in the particle size distribution. See FIG. 2 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the regions of particle size 1-2 μm and particle size 30-70 respectively, indicating that most of the particle size in specification 5 is distributed in particle size 1-2 μm and particle size 30-70 and only small amount of heat dispersing particles with particle size 3-20 μm are present, i.e. exhibiting a two-sided distribution.

other of heat dispersing particles in a same volume, so as to form an effective heat dissipating route.

In an embodiment, for example, alumina with a particle size distribution of 0.1~100 μm and an average particle size of 12 μm or with a particle size distribution of 0.1~20 μm and an average particle size of 4.1 μm is used, wherein the particle size distribution is the range of the particle size of alumina. In another embodiment, considering the smoothness of the substrate, the average particle size may be selected as ⅕~⅖, preferably ⅕~⅓ of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the fluorescent powders and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles*the specific surface area of the heat dispersing particles)/the minimum coating area of the coupling agent. For example, when an epoxy titanate coupling agent is used, the amount of the coupling agent=(the amount of the heat dispersing particles*the specific surface area of the heat dispersing particles)/331.5.

In other specific embodiments of the present disclosure, in order to further improve the properties of the organosilicon-modified polyimide resin composition in the synthesis process, an additive such as a defoaming agent, a leveling agent or an adhesive may be selectively added in the process of synthesizing the organosilicon-modified polyimide resin composition, as long as it does not affect light resistance, mechanical strength, heat resistance and chromism of the

TABLE 3-2

| Specification | 1 | 2 | 3 | 4 | 5 | 6 | 7 |
|---|---|---|---|---|---|---|---|
| Average Particle Size [μm] | 2.7 | 6.6 | 9.0 | 9.6 | 13 | 4.1 | 12 |
| Particle Size Distribution [μm] | 1~7 | 1~20 | 1~30 | 0.2~30 | 0.2~110 | 0.1~20 | 0.1~100 |
| Thermal Conductivity [W/m*K] | 1.65 | 1.48 | 1.52 | 1.86 | 1.68 | 1.87 | 2.10 |

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each product. The defoaming agent is used to eliminate the foams produced in printing, coating and curing. For example, acrylic acid or silicone surfactants may be used as the defoaming agent. The leveling agent is used to eliminate the bumps in the film surface produced in printing and coating. Specifically, adding preferably 0.01~2 wt % of a surfactant component can inhibit foams. The coating film can be smoothened by using acrylic acid or silicone leveling agents, preferably non-ionic surfactants free of ionic impurities. Examples of the adhesive include imidazole compounds, thiazole compounds, triazole compounds, organoaluminum compounds, organotitanium compounds and silane coupling agents. Preferably, the amount of these additives is no more than 10% of the weight of the organosilicon-modified polyimide. When the mixed amount of the additive exceeds 10 wt %, the physical properties of the resultant coating film tend to decline, and it even leads to deterioration of the light resistance due to the presence of the volatile components.

Mechanical Strength

The factors affecting the mechanical strength of the organosilicon-modified polyimide resin composition include at least the type of the main material, the siloxane content, the type of the modifier (thermal curing agent), the fluorescent powders and the content of the heat dispersing particles.

Different organosilicon-modified polyimide resins have different properties. Table 4 lists the main properties of the fluorinated aromatic, semi-aliphatic and full aliphatic organosilicon-modified polyimide, respectively, with a siloxane content of about 45% (wt %). The fluorinated aromatic has the best resistance to thermochromism. The full aliphatic has the best light transmittance. The fluorinated aromatic has both high tensile strength and high elastic modulus. The conditions for testing the mechanical strengths shown in Table 4~6: the organosilicon-modified polyimide resin composition has a thickness of 50 μm and a width of 10 mm, and the tensile strength of the film is determined according to ISO527-3:1995 standard with a drawing speed of 10 mm/min.

and the presence of particles (fluorescent powders and alumina) on the elastic modulus of the organosilicon-modified polyimide resin composition. Where no fluorescent powder or alumina particle is added, the elastic modulus of the organosilicon-modified polyimide resin composition is always less than 2.0 GPa, and as the siloxane content increases, the elastic modulus tends to decline, i.e. the organosilicon-modified polyimide resin composition tends to soften. However, where fluorescent powders and alumina particles are added, the elastic modulus of the organosilicon-modified polyimide resin composition may be significantly increased, and is always higher than 2.0 GPa. Accordingly, the increase in the siloxane content may lead to softening of the organosilicon-modified polyimide resin composition, which is advantageous for adding more fillers, such as more fluorescent powders or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation

TABLE 4

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermochromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more than 2.0 GPa, preferably 2~6 GPa, more preferably 4~6 GPa. Table 5 shows the effects of different siloxane contents at break of more than 0.5%, preferably 1~5%, most preferably 1.5~5%. As shown in Table 5, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where fluorescent powders and alumina particles are added, the organosilicon-modified polyimide resin composition exhibits decreased elongation at break and increased elastic modulus, thereby increasing the occurrence of warpage.

TABLE 5

| Siloxane Content (wt %) | Addition of Fluorescent Powders, Alumina | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 37 | x | BPA | 158 | 33.2 | 1.7 | 10 | 85 | Δ | 83 |
| 37 | o | BPA | — | 26.3 | 5.1 | 0.7 | — | — | — |
| 41 | x | BPA | 142 | 38.0 | 1.4 | 12 | 92 | o | 90 |
| 41 | o | BPA | — | 19.8 | 4.8 | 0.8 | — | — | — |
| 45 | x | BPA | 145 | 24.2 | 1.1 | 15 | 97 | Δ | 90 |
| 45 | o | BPA | — | 21.5 | 4.2 | 0.9 | — | — | — |
| 64 | x | BPA | 30 | 8.9 | 0.04 | 232 | 94 | o | 92 |
| 64 | o | BPA | — | 12.3 | 3.1 | 1.6 | — | — | — |
| 73 | x | BPA | 0 | 1.8 | 0.001 | 291 | 96 | o | 95 |
| 73 | o | BPA | — | 9.6 | 2.5 | 2 | — | — | — |

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 6 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 10

Specific Information of PAME, KF8010, X22-161A, X22-161B, NH15D, X22-163, X22-163A and KF-105

| Product Name | Viscosity at 25° C. (mm²/s) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6~2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

TABLE 6

| Organosilicon-Modified Polyimide | Thermal Curing Agent | | Transmittance (%) | | | Film Thickness (μm) | Mechanical Strength | |
|---|---|---|---|---|---|---|---|---|
| | Type | Amount (%) | 380 nm | 410 nm | 450 nm | | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

TABLE 7

Specific Information of BPA

| Product Name | Viscosity at 25° C. (mPa·s) | Color (G) | Content of Hydrolysable Chlorine (mg/kg) | Equivalent of Epoxy (g/mol) | Hue APHA |
|---|---|---|---|---|---|
| BPA | 11000-15000 | ≤1 | ≤300 | 184-194 | ≤30 |

TABLE 8

Specific Information of 2021P

| Product Name | Viscosity at 25° C. (mPa·s) | Specific Gravity (25/25° C.) | Melting Point (° C.) | Boiling Point (° C./4 hPa) | Water Content (%) | Equivalent of Epoxy (g/mol) | Hue APHA |
|---|---|---|---|---|---|---|---|
| 2021P | 250 | 1.17 | −20 | 188 | 0.01 | 130 | 10 |

TABLE 9

Specific Information of EHPE3150 and EHPE3150CE

| Product Name | Viscosity at 25° C. (mPa·s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

The organosilicon-modified polyimide resin composition of the present disclosure may be used in a form of film or as a substrate together with a support to which it adheres. The film forming process comprises three steps: (a) coating step: spreading the above organosilicon-modified polyimide resin composition on a peelable body by coating to form a film; (b) heating and drying step: heating and drying the film together with the peelable body to remove the solvent from the film; and (c) peeling step: peeling the film from the peelable body after the drying is completed to give the organosilicon-modified polyimide resin composition in a form of film. The above peelable body may be a centrifugal film or other materials which do not undergo chemical reaction with the organosilicon-modified polyimide resin composition, e.g., PET centrifugal film.

The organosilicon-modified polyimide resin composition may be adhered to a support to give an assembly film, which may be used as the substrate. The process of forming the assembly film comprises two steps: (a) coating step: spreading the above organosilicon-modified polyimide resin composition on a support by coating to from an assembly film; and (b) heating and drying step: heating and drying the assembly film to remove the solvent from the film.

In the coating step, roll-to-roll coating devices such as roller coater, mold coating machine and blade coating machine, or simple coating means such as printing, inkjeting, dispensing and spraying may be used.

The drying method in the above heating and drying step may be drying in vacuum, drying by heating, or the like. The heating may be achieved by a heat source such as an electric heater or a heating media to produce heat energy and indirect convection, or by infrared heat radiation emitted from a heat source.

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

Figure 3:
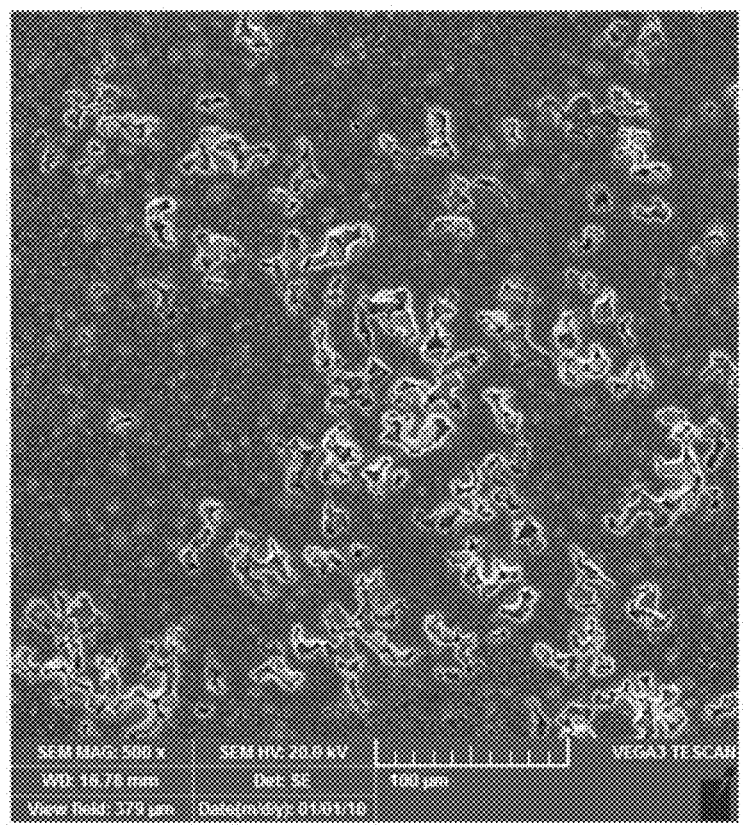
FIG. 3 shows the SEM image of an organosilicon-modified polyimide resin composition composite film (substrate).
Figure 4A:
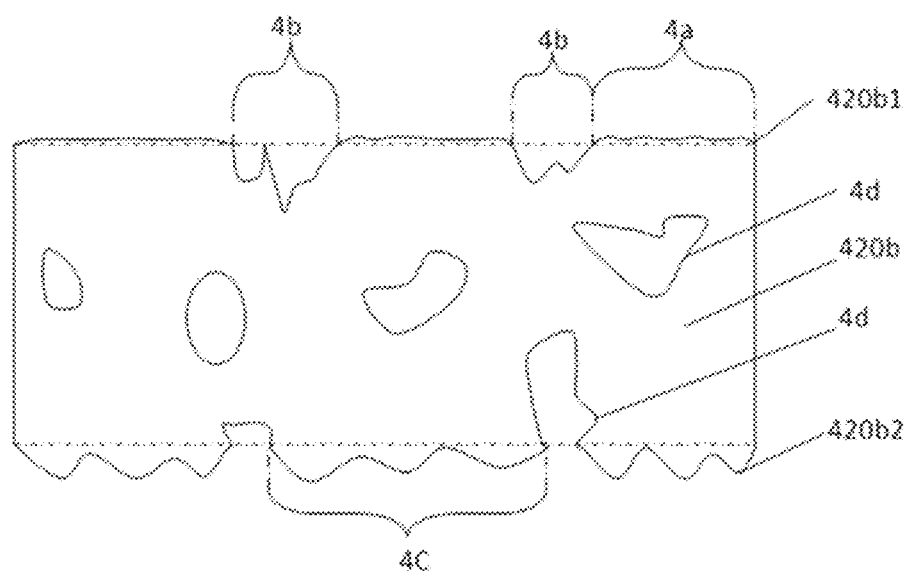
FIG. 4a shows the cross-sectional scheme of an organosilicon-modified polyimide resin composition composite film (substrate) according to an embodiment of the present disclosure.
Figure 4B:
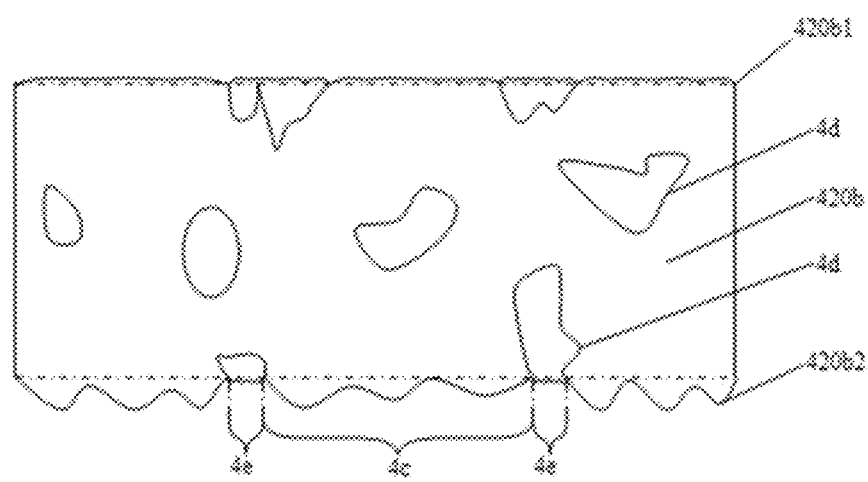
FIG. 4b shows the cross-sectional scheme of an organosilicon-modified polyimide resin composition composite film (substrate) according to another embodiment of the present disclosure.

In an embodiment, the amidation is carried out in a nitrogen atmosphere, or vacuum defoaming is employed in the synthesis of the organosilicon-modified polyimide resin composition, or both, so that the volume percentage of the cells in the organosilicon-modified polyimide resin composition composite film is 5~20%, preferably 5~10%. As shown in FIG. 4a, the organosilicon-modified polyimide resin composition composite film is used as the substrate for the LED soft filament. The substrate 420b has an upper surface 420b1 and an opposite lower surface 420b2. FIG. 3 shows the surface morphology of the substrate after gold is scattered on the surface thereof as observed with vega3 electron microscope from Tescan Corporation. As can be seen from FIG. 4a and the SEM image of the substrate surface shown in FIG. 3, there is a cell 4d in the substrate, wherein the cell 4d represents 5~20% by volume, preferably 5~10% by volume, of the substrate 420b, and the cross section of the cell 4d is irregular. FIG. 4a shows the cross-sectional scheme of the substrate 420b, wherein the dotted line is the baseline. The upper surface 420b1 of the substrate comprises a first area 4a and a second area 4b, wherein the second area 4b comprises a cell 4d, and the first area 4a has a surface roughness which is less than that of the second area 4b. The light emitted by the LED chip passes through the cell in the second area and is scattered, so that the light emission is more uniform. The lower surface 420b2 of the substrate comprises a third area 4c, which has a surface roughness which is higher than that of the first area 4a. When the LED chip is positioned in the first area 4a, the smoothness of the first area 4a is favorable for subsequent bonding and wiring. When the LED chip is positioned in the second area 4b or the third area 4c, the area of contact between the die bonding glue and substrate is large, which improves the bonding strength between the die bonding glue and substrate. Therefore, by positioning the LED chip on the upper surface 420b1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420b may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 4b. The upper surface 420b1 of the substrate has relatively uniform surface roughness. The lower surface 420b2 of the substrate comprises a third area 4c and a fourth area 4e, wherein the third area 4c has a surface roughness which is higher than that of the fourth area 4e. The surface roughness of the upper surface 420b1 of the substrate may be equal to that of the fourth area 4e. The surface of the substrate 420b may be treated so that a material with a high reactivity and a high strength can partially enter the cell 4d, so as to improve the strength of the substrate.

When the organosilicon-modified polyimide resin composition is prepared by vacuum defoaming, the vacuum used in the vacuum defoaming may be −0.5~−0.09 MPa, preferably −0.2~0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3~8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjeting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility. Therefore, flexible structures such as ether (such as (4,4'-bis(4-amino-2-trifluoromethylphenoxy)diphenyl ether), carbonyl, methylene may be introduced into the backbone of the organosilicon-modified polyimide. In other embodiments, a diamine or dianhydride comprising a pyridine ring may be employed, in which the rigid structure of the pyridine ring can improve the mechanical properties of the composite film. Meanwhile, by using it together with a strong polar group such as —F, the composite film may have superior light transmittance. Examples of the anhydride comprising a pyridine ring include 2,6-bis(3',4'-dicarboxyphenyl)-4-(3",5"-bistrifluoromethylphenyl)pyridine dianhydride.

Figure 5:
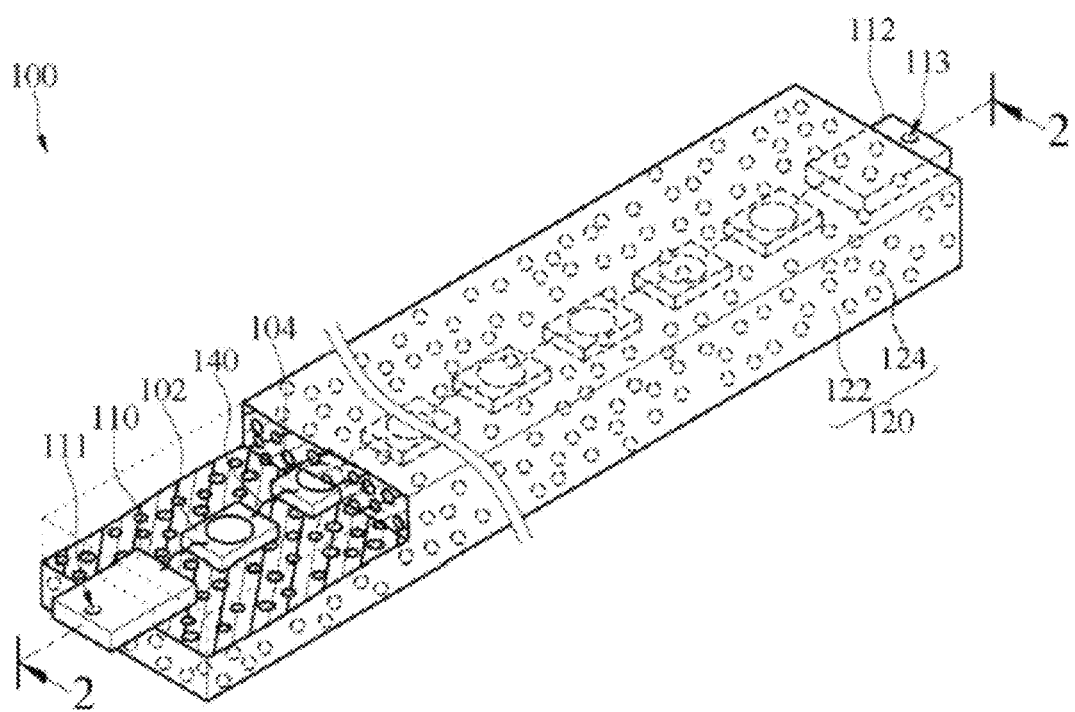
FIG. 5 shows the perspective partially sectioned scheme of an LED filament according to an embodiment of the present disclosure.

As shown in FIG. 5, the LED filament 100 comprises a plurality of LED chips 102, 104; at least two electrodes 110, 112; and alight-conversion layer 120 comprising an adhesive 122 and wavelength conversion particles 124. The adhesive 122 may be the above organosilicon-modified polyimide, so as to have better toughness, and reduce the occurrence of cracking or brittleness. The light conversion particles in the light-conversion layer 120 (which may be any light conversion material such as fluorescent powders or dye, and fluorescent powders 124 are described hereinafter as an example) can absorb certain radiation (e.g., light) to emit light. The light-conversion layer 120 may further comprise inorganic heat dispersing particles to improve the heat dissipation ability.

Figure 6:
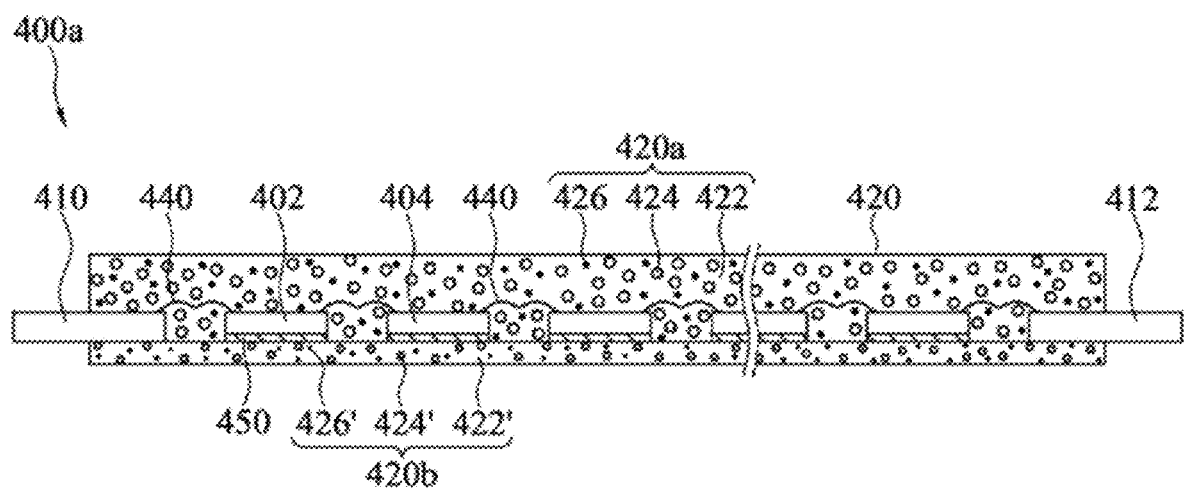
FIG. 6 shows the cross-sectional scheme of the layered structure of a filament according to an embodiment of the present disclosure.

As shown in FIG. 6, the LED filament 400a comprises a light-conversion layer 420; LED chips 402, 404; electrodes 410, 412; and gold wires 440 for electrically connecting an LED chip to another LED chip (or to an electrode). The light-conversion layer 420 is coated on at least two sides of the LED chip/electrode. The light-conversion layer 420 exposes a portion of the electrodes 410, 412. The light-conversion layer 420 may comprise at least a top layer 420a and a base layer 420b, as the top layer and the base layer of the filament, respectively. In this embodiment, the top layer 420a and the base layer 420b are located at two sides of the LED chip/electrode, respectively.

The top layer 420a has a layered structure of at least one layer. The layered structure may be selected from a fluorescent powder adhesive layer having a high plasticity, a fluorescent powder film layer having a low plasticity, a transparent layer or any layered combination thereof. Each of the fluorescent powder adhesive layer and the fluorescent powder film layer of the top layer 420a can comprise an adhesive 422, fluorescent powders 424, and inorganic oxide nanoparticles 426. The adhesive 422 may be, but not limited to, silica gel. In an embodiment, the adhesive 422 may comprise 10 wt % or less the above organosilicon-modified polyimide, to improve the overall hardness, insulation, thermal stability and mechanical strength of the filament. The solid content of the organosilicon-modified polyimide may be 5-40 wt %, and the rotational viscosity may be 5-20 Pa. S. The inorganic oxide nanoparticles 426 may be, but not limited to, alumina and aluminum nitride particles, and the particle size thereof may be 100-600 nm or 0.1-100 µm. Its function is to improve the heat dissipation of the filament. The incorporated inorganic heat dispersing particles may have variousparticle sizes. Suitable adjustment may be made to differentiate the particles as required in their properties such as hardness (e.g., by adjusting the composition of the packaging adhesive or the ratio of the fluorescent powders), conversion of wavelength, particle size of the components, thickness and transmittance. The percent of transmittance of the fluorescent powder adhesive layer or the fluorescent powder film layer of the top layer 420a can be varied depending on needs. For example, the percent of transmittance of the fluorescent powder adhesive layer or the fluorescent powder film layer of the top layer 420a can be greater than 20%, 50%; or 70%. The fluorescent powder adhesive may have a Shore D hardness of 40-70 and a thickness of 0.2-1.5 mm; while the fluorescent powder film may have a Shore D hardness of 20-70, a thickness of 0.1-0.5 mm, a refractive index of 1.4 or above, and a transmittance of 40%-95%. The transparent layer (adhesive layer, insulating layer) may be composed of a high tranmittance resin such as silica gel, the above organosilicon-modified polyimide, or a combination thereof. In an embodiment, the transparent layer may be used as a refractive index matching layer, playing a role of adjusting the light emission efficiency of the filament.

The base layer has a layered structure of at least one layer. The layered structure may be selected from a fluorescent powder adhesive layer having a high plasticity, a fluorescent powder film layer having a low plasticity, a transparent layer or any layered combination thereof. Each of the fluorescent powder adhesive layer and the fluorescent powder film layer of the top layer 420a can comprise organosilicon-modified polyimide 422', fluorescent powders 424', and inorganic oxide nanoparticles 426'. In an embodiment, the organosilicon-modified polyimide may be replaced by the above organosilicon-modified polyimide resin composition. The inorganic oxide nanoparticles 426 may be, but not limited to, alumina and aluminum nitride particles, and the particle size thereof may be 100-600 nm or 0.1-100 µm. Its function is to improve the heat dissipation of the filament. The incorporated inorganic heat dispersing particles may have various particle sizes. The percent of transmittance of the fluorescent powder adhesive layer or the fluorescent powder film layer of the base layer 420b can be varied depending on needs. For example, the percent of transmittance of the fluorescent powder adhesive layer or the fluorescent powder film layer of the base layer 420b can be greater than 20%, 50%; or 70%. The transparent layer (adhesive layer, insulating layer) may be composed of a high tranmittance resin such as silica gel, the above organosilicon-modified polyimide, or a combination thereof. In an embodiment, the transparent layer may be used as a refractive index matching layer, playing a role of adjusting the light emission efficiency of the filament. In an embodiment, the base layer may be the above organosilicon-modified polyimide resin composition composite film.

Figure 7:
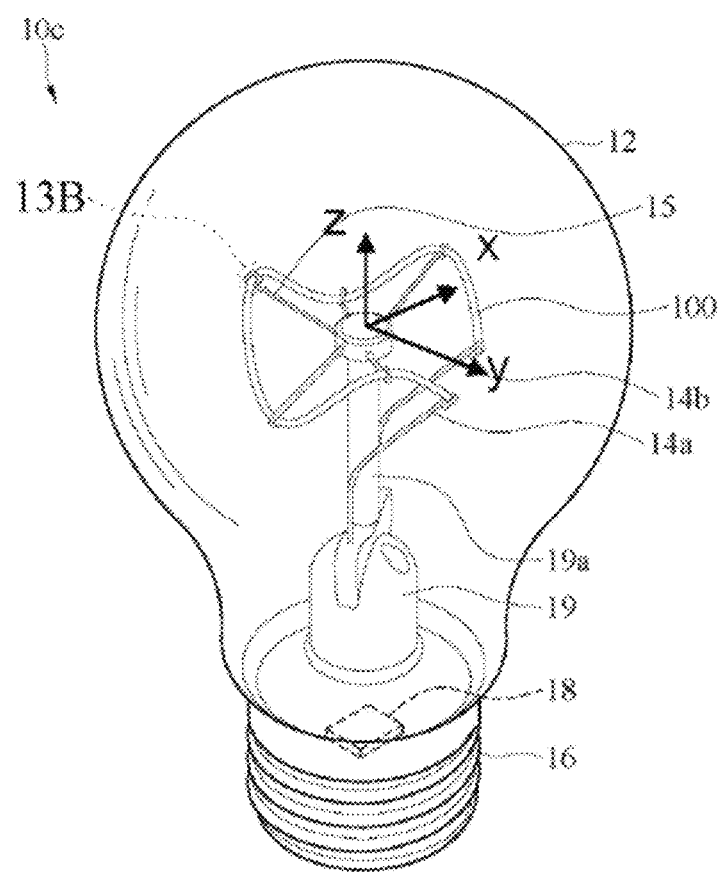
FIG. 7 shows the perspective scheme of an LED bulb according to the present disclosure.

As shown in FIG. 7, the LED bulb 10c comprises a lamp shell 12, a lamp holder 16 connected to the lamp shell 12, at least two conductive supports 14a, 14b disposed within the lamp shell 12, a driving circuit 18, cantilevers 15, a stem 19, and one LED filament 100. The conductive supports 14a, 14b are used to electrically connecting two electrodes 110, 112 of the LED filament, or to support the weight of the LED filament 100. The LED filament 100 is connected to the stem 19 through the conductive supports 14a, 14b, and the stem 19 may be used to draw the gas in the LED bulb 10b and to provide thermal conductivity. The stem 19 further has a stand 19a which vertically extends to the center of the lamp shell 12. Each cantilever 15 has a first end which is connected to the stand 19a, and a second end which is connected to the LED filament. The driving circuit 18 electrically connects the conductive supports 14a, 14b to the lamp holder 16. When the lamp holder 16 is connected to a conventional lamp socket, the lamp socket provides power for the lamp holder 16, and the driving circuit 18 obtains power from the lamp holder 16 and drives the LED filament 100 to emit light. Since the LED filament 100 can provide omnidirectional illumination, the whole LED bulb can provide omnidirectional illumination. The LED filament 100 may be any LED filament shown in FIGS. 4-5.

The definition of the term "omnidirectional illumination" herein depends on the specifications in various countries for specific bulbs, and may vary with time. Accordingly, the examples provided herein of omnidirectional illumination is not intended to limit the scope of the present disclosure. For the definition of the omnidirectional illumination, reference may be made to, for example, US Energy Star Program Requirements for Lamps (Light Bulbs), which provides a definition of the light patternof the light bulb (omnidirectional lamp): when the bulb is disposed in a direction that the base is up and the bulb is down, the upward direction is set as 180°, and the downward direction is set as 0°, the requirements are: the difference between the luminous intensity (cd) at any angle in the range of 0-135° and the average luminous intensity should not exceed 25%, while the total flux (lm) in the range of 135-180° represents at least 5% of the whole bulb. As another example, JEL 801 Specification of Japan requires that for LED lamps, the flux in the range of 120° should be less than 70% of the total flux.

The present disclosure is disclosed above by referring to optimum embodiments. However, it should be understood by a person skilled in the art that these embodiments are only used to describe some ways of implementing the present disclosure, and should not be construed as being restrictive. It should be noted that any change or modification equivalent to these embodiments and any reasonable combinations of these embodiments should all be within the scope being supported by the description. Therefore, the scope of the present disclosure should be determined by the appended claims.

What is claimed is:

1. An organosilicon-modified polyimide resin composition, comprising an organosilicon-modified polyimide having an number average molecular weight of 5000~100000 and a thermal curing agent selected from the group consisting of epoxy resin, isocyanate and bisoxazoline compounds, the organosilicon-modified polyimide comprising a repeating unit represented by the following general formula (I):

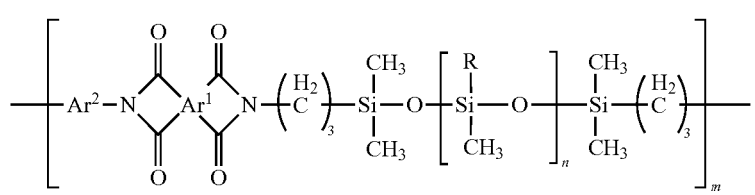

wherein $Ar^1$ is a tetra-valent organic group having an alicyclic hydrocarbon structure, $Ar^2$ is a di-valent organic group having a monocyclic alicyclic hydrocarbon structure, R is each independently methyl or phenyl, n is 1~5, and the di-valent organic group comprises a functional group having an active hydrogen and being selected from the group consisting of any one of amino, carboxy and mercapto.

2. The organosilicon-modified polyimide resin composition according to claim 1, wherein the organosilicon-modified polyimide has an average molecular weight of 10000~60000.

3. The organosilicon-modified polyimide resin composition according to claim 1, wherein the organosilicon-modified polyimide has an average molecular weight of 20000~40000.

4. The organosilicon-modified polyimide resin composition according to claim 1, wherein $Ar^1$ is a tetra-valent organic group having a monocyclic alicyclic hydrocarbon structure or a bridged-ring alicyclic hydrocarbon structure.

5. The organosilicon-modified polyimide resin composition according to claim 1, wherein $Ar^1$ is a tetra-valent organic group having an alicyclic hydrocarbon structure comprising a functional group having active hydrogen, wherein the functional group having active hydrogen is any one of hydroxyl, amino, carboxy and mercapto.

6. The organosilicon-modified polyimide resin composition according to claim 1, wherein $Ar^1$ is derived from a dianhydride, and $Ar^2$ is derived from a diamine.

7. The organosilicon-modified polyimide resin composition according to claim 6, wherein 5~25% by molar of the total amount of diamine comprises a functional group having active hydrogen.

8. The organosilicon-modified polyimide resin composition according to claim 1, wherein siloxane content in the organosilicon-modified polyimide is 20~75 wt %.

9. The organosilicon-modified polyimide resin composition according to claim 1, wherein siloxane content in the organosilicon-modified polyimide is 30~70 wt %, and the composition has a glass transition temperature of below 150° C.

10. The organosilicon-modified polyimide resin composition according to claim 5, wherein the molar ratio of the thermal curing agent to the functional group having active hydrogen in the organosilicon-modified polyimide is 1:1.

11. The organosilicon-modified polyimide resin composition according to claim 6, wherein the molar ratio of the thermal curing agent to the functional group having active hydrogen in the organosilicon-modified polyimide is 1:1.

12. The organosilicon-modified polyimide resin composition according to claim 1, wherein the composition further comprises an additive which is selected from the group consisting of fluorescent powders, heat dispersing particles and a coupling agent.

13. The organosilicon-modified polyimide resin composition according to claim 12, wherein the weight of the heat dispersing particles is 1~12 times the weight of the organosilicon-modified polyimide.

14. The organosilicon-modified polyimide resin composition according to claim 12, wherein the heat dispersing particles are one or more selected from the group consisting of silica, alumina, magnesium oxide, magnesium carbonate, aluminum nitride, boron nitride and diamond.

15. The organosilicon-modified polyimide resin composition according to claim 12, wherein the heat dispersing particles have a particle size distribution of 0.1~100 μM.

16. The organosilicon-modified polyimide resin composition according to claim 12, wherein the heat dispersing particles have a particle size distribution from 1 μm to 50 μM.

17. The organosilicon-modified polyimide resin composition according to claim 12, wherein the heat dispersing particles have a particle size distribution of 0.1~100 μM, and the content of small particle size of below 1 μm is 5-20%, the content of medium particle size of 1-30 μm is 50-70%, and the content of large particle size of above 30 μm is 20-40%.

18. The organosilicon-modified polyimide resin composition according to claim 12, wherein the fluorescent powders have an average particle size of above 0.1 μm.

19. The organosilicon-modified polyimide resin composition according to claim 12, wherein the fluorescent powders have an average particle size from 1 μm to 100 μm.

20. The organosilicon-modified polyimide resin composition according to claim 12, wherein the fluorescent powders have an average particle size from 1 to 50 μm.

21. The organosilicon-modified polyimide resin composition according to claim 12, wherein the weight ratio of the fluorescent powders to the organosilicon-modified polyimide is 50~800:100.

22. The organosilicon-modified polyimide resin composition according to claim 12, wherein the weight ratio of the fluorescent powders to the organosilicon-modified polyimide is 100~700:100.

23. The organosilicon-modified polyimide resin composition according to claim 1, wherein the composition further comprises one or more of a defoaming agent, a leveling agent and an adhesive.

24. A filament substrate, which is formed from the organosilicon-modified polyimide resin composition according to claim 1 and fluorescent powders.

25. The filament substrate according to claim 24, having at least one of the following properties: a thermal conductivity of more than 1.8 W/m*K; an elastic modulus of more than 2.0 GPa; and an elongation at break of more than 0.5%.

* * * * *